US007791504B2

(12) United States Patent
Sugahara et al.
(10) Patent No.: US 7,791,504 B2
(45) Date of Patent: Sep. 7, 2010

(54) ROTARY ENCODER AND METHOD OF MANUFACTURING THE SAME

(75) Inventors: Jun Sugahara, Okayama (JP); Jun Sato, Okayama (JP); Takumi Nishimoto, Okayama (JP); Kenji Kataoka, Okayama (JP)

(73) Assignee: Panasonic Corporation, Osaka (JP)

(*) Notice: Subject to any disclaimer, the term of this patent is extended or adjusted under 35 U.S.C. 154(b) by 15 days.

(21) Appl. No.: 12/352,745

(22) Filed: Jan. 13, 2009

(65) Prior Publication Data

US 2009/0184848 A1 Jul. 23, 2009

(30) Foreign Application Priority Data

Jan. 18, 2008 (JP) ............................ 2008-008865

(51) Int. Cl.
*H03M 1/22* (2006.01)

(52) U.S. Cl. .......................................... 341/16; 200/14

(58) Field of Classification Search .................. 341/16; 200/14

See application file for complete search history.

(56) References Cited

U.S. PATENT DOCUMENTS 5,927,486 A * 7/1999 Kamiya ..................... 200/565
6,975,249 B2 * 12/2005 Hashimoto et al. ............ 341/16
7,012,201 B2 * 3/2006 Kodani et al. ................ 200/14

FOREIGN PATENT DOCUMENTS

JP 11-135310 5/1999

* cited by examiner

*Primary Examiner*—Peguy JeanPierre
(74) *Attorney, Agent, or Firm*—Wenderoth, Lind & Ponack, LLP.

(57) ABSTRACT

A rotary encoder includes a case made of insulating resin, a rotatable operation shaft, a slidable brush fixed to the operation shaft, and a signal contact embedded in a surface of the case. The slidable brush has a contacting section slidable on a surface of the case on a predetermined circumference according to a rotation of the operation shaft. The signal contact has an upper surface flush with the surface of the case, a first side surface connected to the upper surface at a first corner having a right angle, a second side surface connected to the upper surface at a second corner having a right angle, and a lower surface opposite to the upper surface. The first and side surfaces are positioned on the predetermined circumference. The lower surface has a width smaller than a width of the upper surface. This rotary encoder has a small size and outputs a signal precisely.

2 Claims, 14 Drawing Sheets

Fig. 10 – PRIOR ART
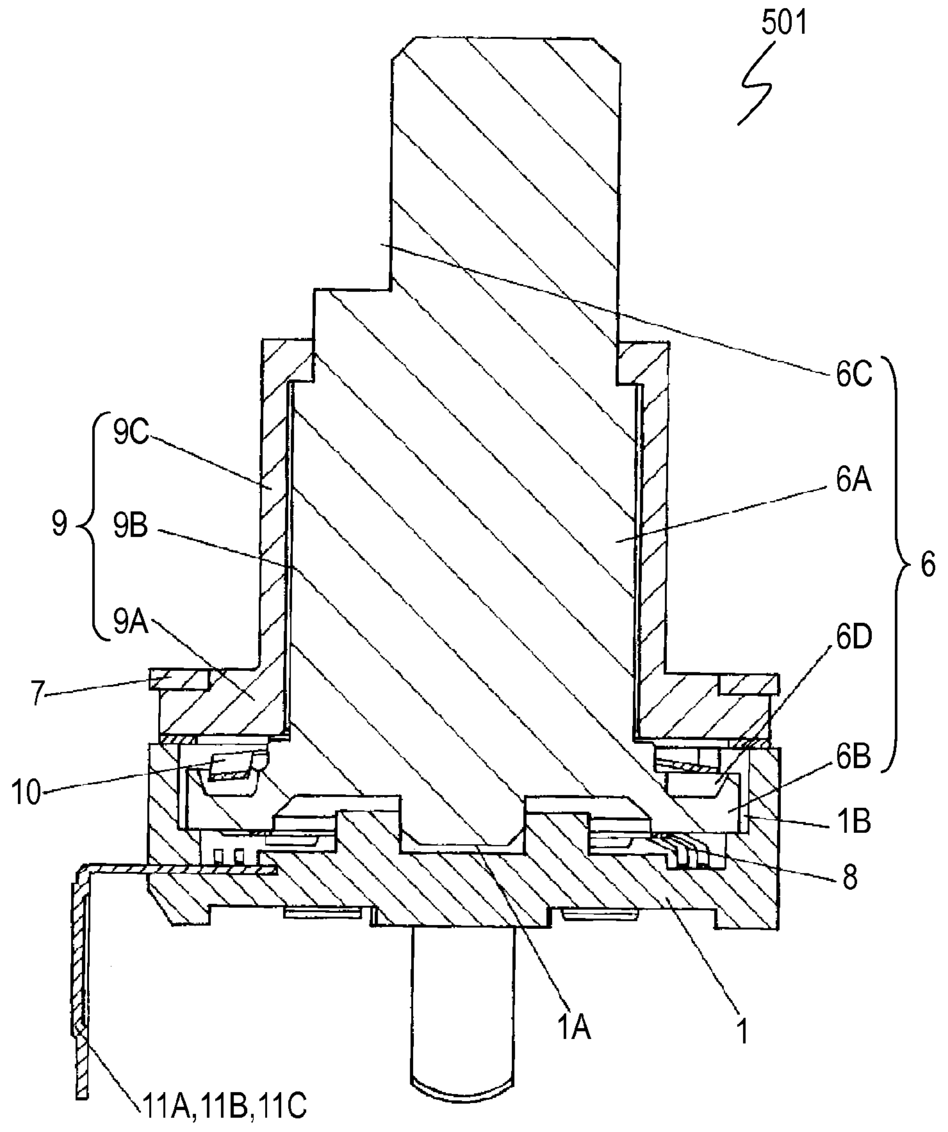

Fig. 11 – PRIOR ART
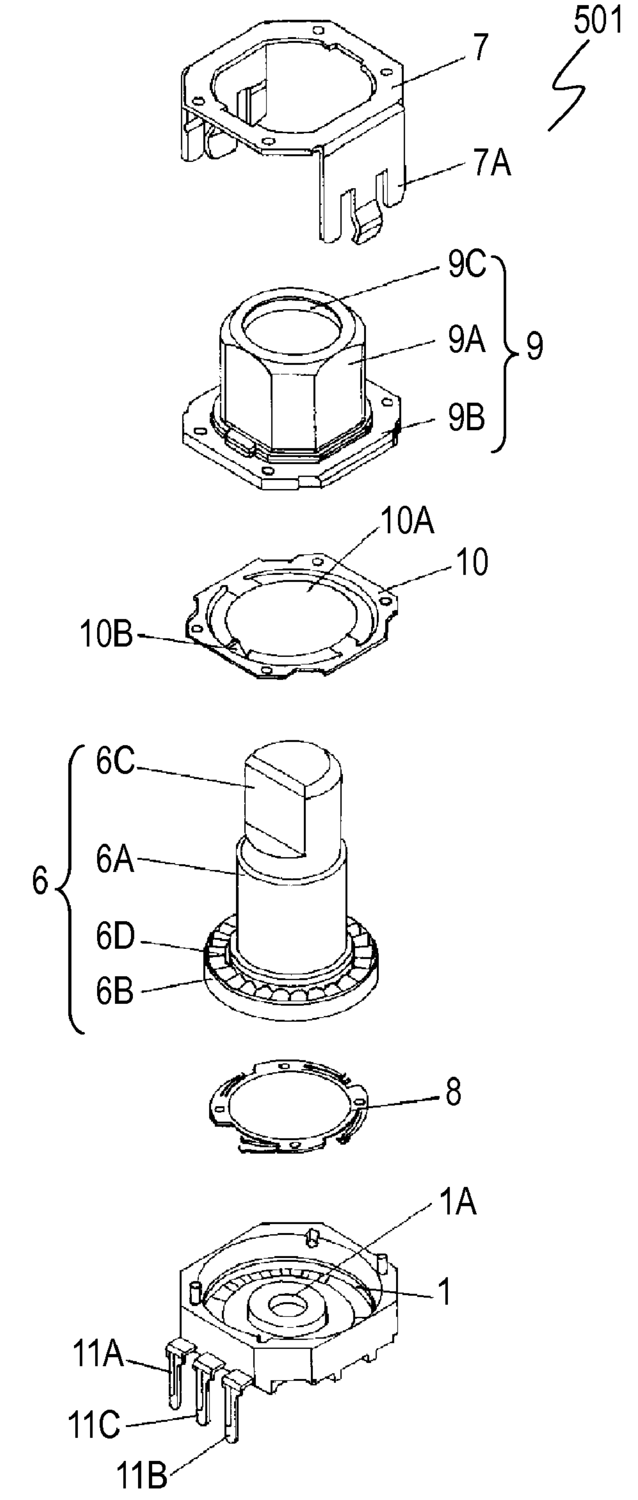

Fig. 12 – PRIOR ART
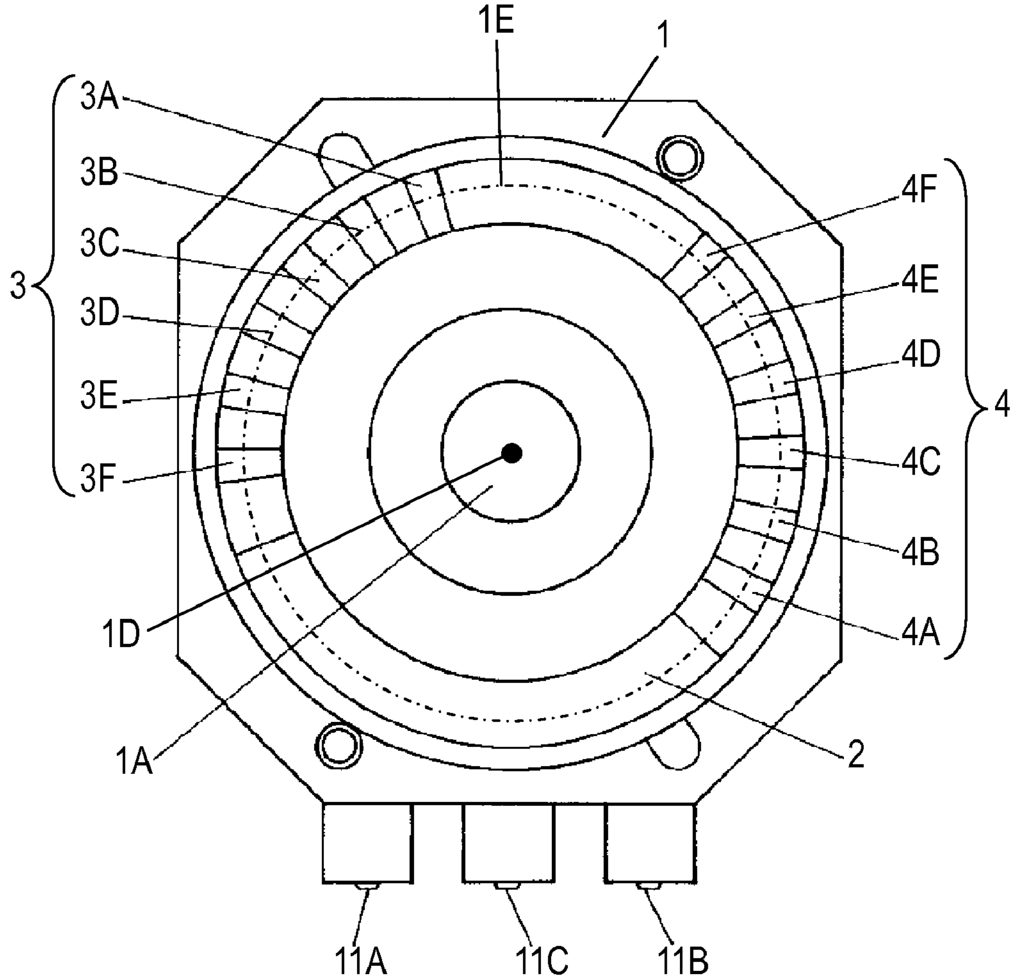

Fig. 13 – PRIOR ART
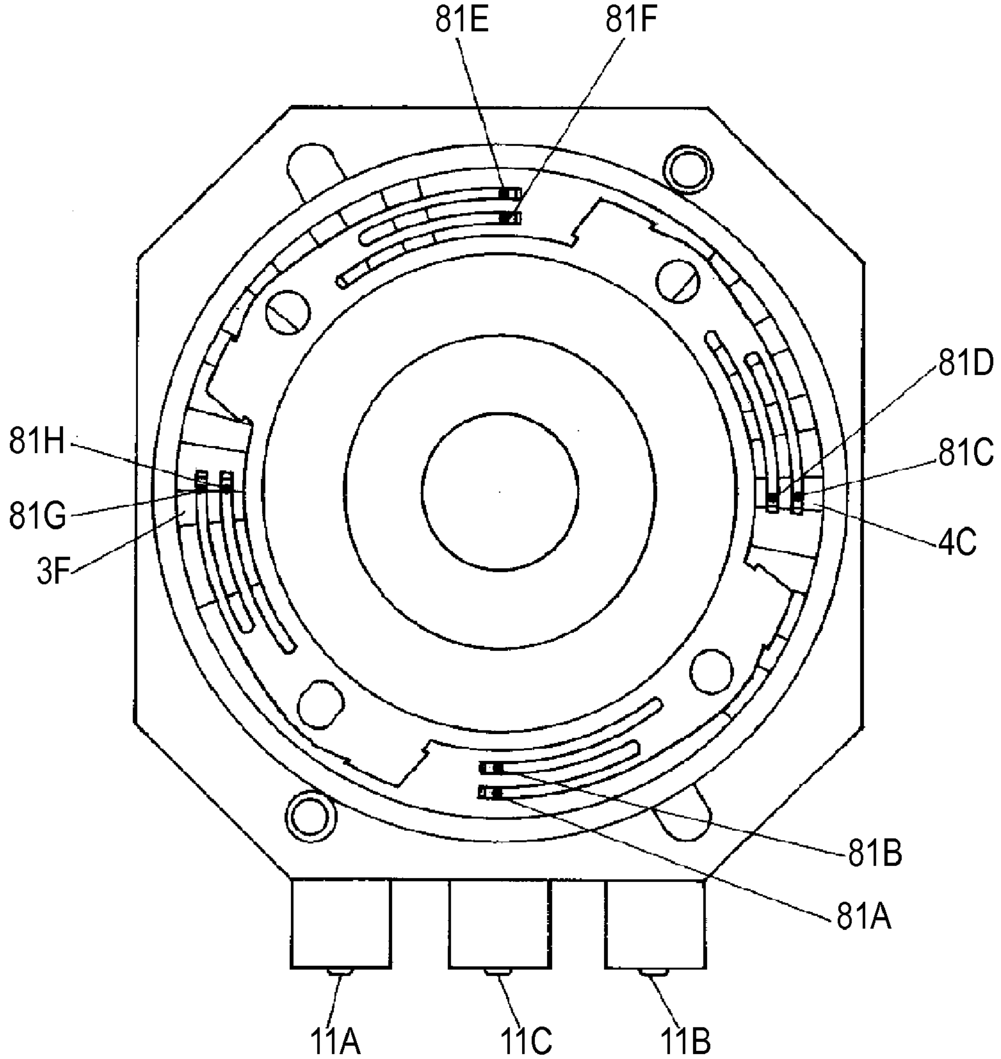

Fig. 14A – PRIOR ART
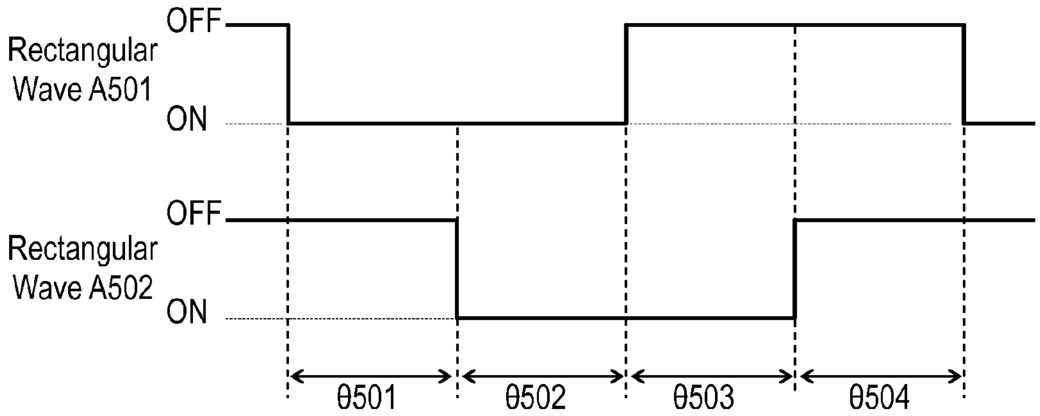
Fig. 14B – PRIOR ART
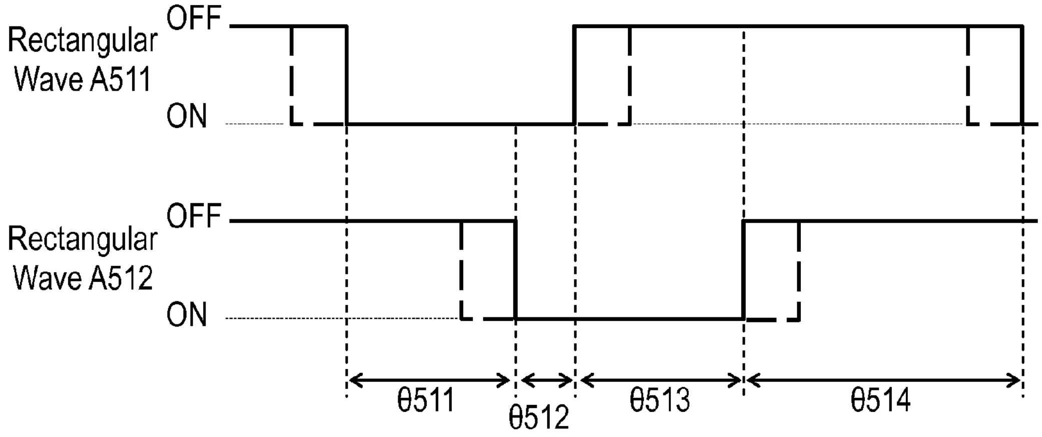

Fig. 15 – PRIOR ART
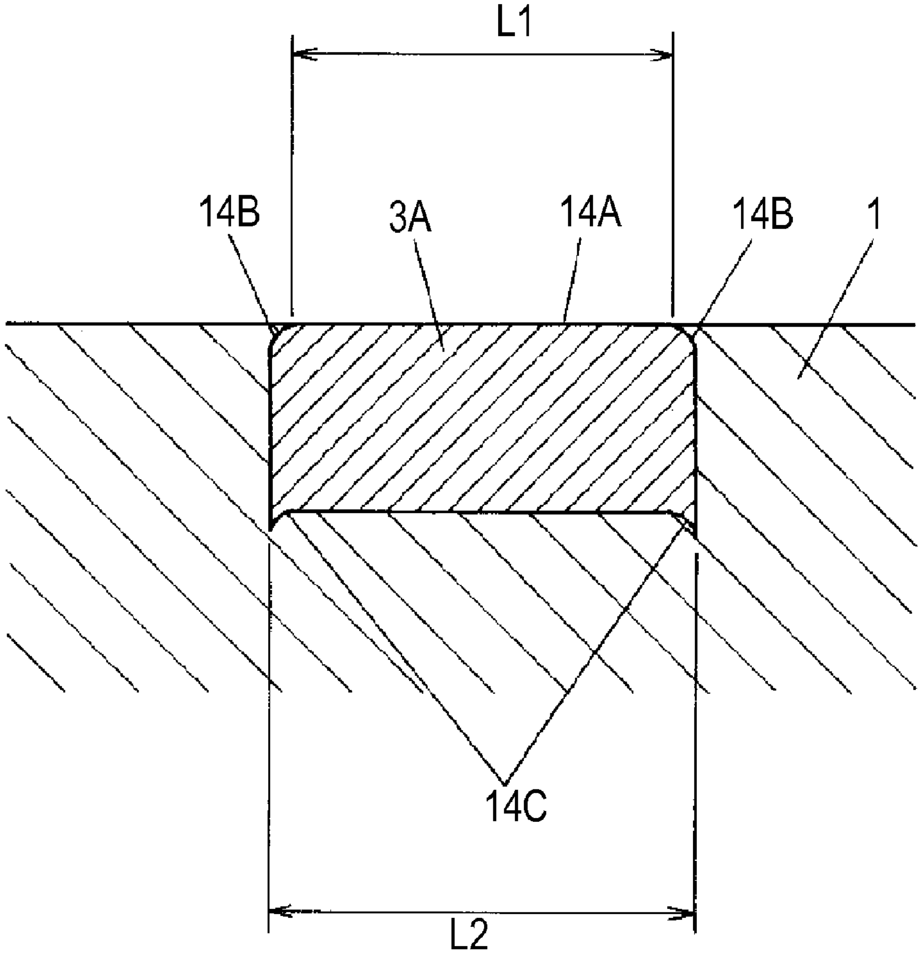

ROTARY ENCODER AND METHOD OF MANUFACTURING THE SAME

FIELD OF THE INVENTION

The present invention relates to a rotary encoder used for operation of an electronic device, and to a method of manufacturing the encoder.

BACKGROUND OF THE INVENTION

Rotary encoders have been recently used for input sections, such as menu selectors and volume controllers of various electronic devices, such as car audio systems. The rotary encoders have been required to have small sizes and to control the devices precisely.

FIGS. 10 and 11 are a cross-sectional view and an exploded perspective view of conventional rotary encoder 501 disclosed in JP11-135310, respectively. Operation shaft 6 is made of molding resin and has center columnar section 6A having a circular column shape and annular flange 6B protruding from the outer circumference of center columnar section 6A. The upper part of center columnar section 6A has cutout 6C therein adapted for engagement in an operation dial. An upper surface of annular flange 6B has click grooves 6D extending radially. A caulking protrusion being crushed, slidable brush 8 is fixed to a lower surface of annular flange 6B.

Shaft supporter 9 is made of resin and has protruding section 9A having an octagonal columnar shape, and flat plate section 9B having an octagonal shape and protruding from an outer circumference of protruding section 9A. Cylindrical hole 9C having a cylindrical shape is provided in a center of shaft supporter 9 to penetrate shaft supporter 9. Center columnar section 6A of operation shaft 6 is inserted into cylindrical hole 9C. A caulking protrusion is crushed to fix click spring 10 to a lower surface of flat plate section 9B.

Center columnar section 6A of operation shaft 6 is inserted into circular hole 10A provided in a center of click spring 10. A spring 10B is provide along an outer circumference of circular hole 10A. Spring 10B elastically contacts click grooves 6D provided in the upper surface of annular flange 6B.

Case 1 is made of resin and has recess 1B therein opening upward. Center hole 1A is provided in a center of a bottom surface of recess 1B. A circular columnar protrusion provided at a center of a lower surface of operation shaft 6 is inserted into center hole 1A. Case 1 supports operation shaft 6 rotatably.

Attachment bracket 7 has a squared U-shape and has a center hole. While protruding section 9A of shaft supporter 9 protrudes upward from the center hole, attachment bracket 7 has legs 7A to sandwich shaft supporter 9 and case 1 stacked on each other from above shaft supporter 9. Tips of legs 7A are bent at a lower surface of case 1 to accommodate operation shaft 6 and slidable brush 8 between shaft supporter 9 and case 1.

FIG. 12 is a top view of case 1 of rotary encoder 501. Center hole 1A has a circular shape having center 1D. Common contact 2 and signal contact patterns 3 and 4 are fixed to a bottom surface of recess 1B by insert molding along circular circumference 1E about center 1D of center hole 1A. Common contact 2 and signal contact patterns 3 and 4 are arranged in arcuate shapes on circumference 1E.

As shown in FIG. 12, signal contact pattern 3 includes signal contacts 3A to 3F connected electrically with each other. Signal contact pattern 4 includes signal contacts 4A to 4F connected electrically with each other. Signal contact patterns 3 and 4 and common contact 2 are embedded in the bottom surface of recess 1B of case 1 so that upper surfaces of signal contacts 3A to 3F and 4A to 4F and upper surface of common contact 2 are flush with the bottom surface of recess 1B of case 1. Signal contacts 3A to 3F and 4A to 4F are provided on circumference 1E. Signal contacts 3A to 3F are arranged on circumference 1E within an angular range smaller than 180 degrees about center 1D. Signal contacts 4A to 4F are arranged on circumference 1E within an angular range smaller than 180 degrees about center 1D. The angular range having the signal contacts 3A to 3F arranged therein is away from the angular range having signal contacts 4A to 4F arranged therein, that is, does not overlap the angular range having signal contacts 4A to 4F arranged therein. Common contact 2 has an arcuate shape on circumference 1E. A center angle of the arcuate shape of common contact 2 is larger than the angular range having signal contacts 3A to 3F arranged therein and the angular range having signal contacts 4A to 4F arranged therein. Signal contact pattern 3, signal contact pattern 4, and common contact 2 are electrically insulated from each other, and are connected to terminals 11A, 11B, and 11C extending to an outside of case 1, respectively.

FIG. 13 is a top view of case 1 having rotary encoder 501 having slidable brush 8 arranged thereon. Slidable brush 8 is made of conductive elastic metal plate and is rotatable about center 1D. Slidable brush 8 has contacting sections 81A, 81C, 81E, and 81G arranged with angular intervals of 90 degrees about center 1D, and contacting sections 81B, 81D, 81F, and 81H located further inward than contacting sections 81A, 81C, 81E, and 81G, respectively.

An operation of conventional rotary encoder 501 will be described below.

Upon operation shaft 6 rotating, slidable brush 8 fixed to the lower surface of annular flange 6B of operation shaft 6 rotates. The rotation of slidable brush 8 causes contacting sections 81A to 81H to slide on the bottom surface of recess 1B of case 1 along circumference 1E. Then, contacting sections 81A to 81H contact and are removed from signal contacts 3A to 3F and 4A to 4F and common contact 2. The center angle of the arcuate shape of common contact 2 along circumference 1E is larger than 90 degrees. Thus, regardless of the angular position of slidable brush 8, at least two of contacting sections 81A to 81H contact common contact 2, that is, slidable brush 8 contacts common contact 2.

The angular range having signal contacts 3A to 3F arranged therein is smaller than 90 degrees, and the angular range having signal contacts 4A to 4F arranged therein is smaller than 90 degrees. Each of contacting sections 81A and 81B simultaneously contacts one of signal contacts 3A to 3F and 4A to 4F and common contact 2. Similarly, each of contacting sections 81C and 81D simultaneously contacts one of signal contacts 3A to 3F and 4A to 4F and common contact 2. Similarly, each of contacting sections 81E and 81F simultaneously contacts one of signal contacts 3A to 3F and 4A to 4F and common contact 2. Similarly, each of contacting sections 81G and 81H simultaneously contacts one of signal contacts 3A to 3F and 4A to 4F and common contact 2. Four contacting sections 81A, 81C, 81E, and 81G are arranged at the angular intervals of 90 degrees, and four contacting sections 81B, 81D, 81F, and 81H are arranged at the angular interval of 90 degrees. This arrangement causes each of six signal contacts 3A to 3F to contact and be removed from common contact 2 via slidable brush 8 repetitively four times while operation shaft 6 rotates by 360 degrees. Since signal contacts 3A to 3F are connected electrically with each other as signal contact pattern 3, signal contact pattern 3 is connected to and disconnected from common contact 2 repetitively 24 times while operation shaft 6 rotates by 360 degrees. Similarly, each of six signal contacts 4A to 4F contact and are removed from common contact 2 via slidable brush 8 repetitively 4 times while operation shaft 6 rotates by 360 degrees to rotate slidable brush 8 by 360 degrees. Since signal contacts 4A to 4F are connected electrically with each other as signal contact pattern 4, signal contact pattern 4 is connected to and disconnected from common contact 2 repetitively 24 times while operation shaft rotates by 360 degrees. Thus, rotary encoder 501 outputs rectangular wave A501 having 24 peaks between terminals 11A and 11B due to the connection and disconnection between common contact 2 and signal contact pattern 3 while operation shaft 6 rotates by 360 degrees. Similarly, rotary encoder 501 outputs rectangular wave A502 having 24 peaks between terminals 11A and 11C due to the connection and disconnection between common contact 2 and signal contact pattern 4 while operation shaft 6 rotates by 360 degrees.

The operation dial attached to operation shaft 6 is rotated to input rectangular waves A501 and A502 to a controller implemented by e.g. a microcomputer. Rotary encoder 501 is connected to the controller and is used e.g. to adjust the volume of a car audio system. In this case, the controller detects, based on rectangular waves A501 and A502, a rotation direction and a rotation angle of the operation dial (i.e., operation shaft 6) to control the volume of the car audio system.

FIG. 14A illustrates rectangular waves A501 and A502 output from rotary encoder 501. In FIG. 14A, rectangular waves A501 and A502 are shown by the turning on and off of a switch provided between common contact 2 and signal contact pattern 3 and by the turning on and off of a switch formed between common contact 2 and signal contact pattern 4, respectively. The angular positions and angular widths of signal contacts 3A to 3F and 4A to 4F are determined such that rectangular waves A501 and A502 are output with a phase difference of 90 degrees. The combination of respective statuses of rectangular waves A501 and A502 provides four angular ranges θ501 to θ504: (1) angular range θ501 in which rectangular wave A501 represents the turning on and rectangular wave A502 represents the turning off; (2) angular range θ502 in which rectangular waves A501 and A502 represent the turning on; (3) angular range θ503 in which rectangular wave A501 represents the turning off, and rectangular wave A502 represents the turning on; and (4) angular range θ504 in which rectangular waves A501 and A502 represent the turning off. Based on the order of angular ranges θ501 to θ504, the controller determines a rotation direction of operation shaft 6 and counts the number of the peaks of rectangular waves A501 and A502. The controller controls a controllable object based on the rotation direction and the number of the peaks. In the case that the object is the volume of the car audio system, the controller determines, based on the rotation direction, a changing direction along which the volume is increased or decreased. The controller further determines a change amount based on the number of the peaks. Then, the controller changes the volume by the determined change amount in the determined changing direction.

The widths of angular ranges θ501 to θ504 depend on the widths of signal contacts 3A to 3D and 4A to 4D along circumference 1E. Signal contact patterns 3 and 4 are formed by punching a metal plate using dies designed to provide predetermined widths of angular ranges θ501 to θ504. Rotary encoder 501 includes signal contact patterns 3 and 4 formed by the punching and embedded in the bottom surface of case 1. Rotary encoder 501 may output waveforms different from the waveforms shown in FIG. 14A. FIG. 14B shows rectangular waves A511 and A512 output from rotary encoder 501 including signal contact patterns 3 and 4 formed by the punching, instead of rectangular waves A501 and A502 shown in FIG. 14A. Angular ranges θ511, θ512, θ513, and θ514 shown in FIG. 14B represent statuses of the turning on and off as angular ranges θ501, θ502, θ503, and θ504 shown in FIG. 14A, respectively. As shown in FIG. 14A, angular ranges θ501 to θ504 are equal to each other ideally. However, angular range θ512 is particularly narrow out of angular ranges θ511, θ512, θ513, and θ514 actually, as shown in FIG. 14B. Therefore, upon operation shaft 6 rotating, the microcomputer may not read angular range θ512 if a duration in which contacting sections 81A to 81H of slidable brush 8 slide on in angular range θ512 is excessively short.

FIG. 15 is a cross-sectional view of signal contact 3A (3B to 3F and 4A to 4F) of rotary encoder 501 along circumference 1E. Signal contacts 3A to 3F and 4A to 4F of signal contact patterns 3 and 4 are formed by punching out the metal plate. When the metal plate for forming signal contact 3A is punched out with a die, the die pulls an edge of an upper surface of signal contact 3 in a punching direction, and thus, deforms signal contact 3, thereby producing shear drop portion 14B at the edge of the upper surface. Shear drop portion 14B has a round shape like chamfering the edge of the upper surface. The lower surface of signal contact 3A has burr 14C produced by pulling a part of the metal downward with the die. Width L1 of surface 14A of signal contact 3A exposed on the bottom surface of recess 1B is smaller than width L2 of signal contact 3A. This structure causes the resin of case 1 to cover shear drop portion 14B of signal contact 3A. Width L2 of signal contact 3A is determined to provide the predetermined lengths of angular ranges θ501 to θ504. However, width L1 of surface 14A of signal contact 3A exposed on the bottom surface of recess 1B of case 1 is smaller than determined width L2 of signal contact 3A. Thus, the angular range in which slidable brush 8 contacts signal contact 3A during the rotation of operation shaft 6 is smaller than the predetermined angular range. This reduces the angular ranges in which the switches formed between common contact 2 and signal contact pattern 3 and between common contact 2 and signal contact pattern 4 are turned on. Angular range θ512 in which rectangular waves A511 and A512 represent the turning on is accordingly shorter than other angular ranges θ511, θ513, and θ514, as shown in FIG. 14B.

Under a demand to have a smaller size and operate precisely, rotary encoder 501 is demanded to have smaller widths of signal contacts 3A to 3F and 4A to 4F and smaller intervals between signal contacts 3A to 3F and 4A to 4F. The shape of shear drop portion 14B of signal contacts 3A to 3D and 4A to 4D changes depending on material of the metal plate or conditions of the punching, thus being unpredictable. Thus, shear drop portion 14B may be a factor preventing rotary encoder 501 from having a small size and operating precisely.

SUMMARY OF THE INVENTION

A rotary encoder includes a case made of insulating resin, a rotatable operation shaft, a slidable brush fixed to the operation shaft, and a signal contact embedded in a surface of the case. The slidable brush has a contacting section sliding on a surface of the case on a predetermined circumference according to a rotation of the operation shaft. The signal contact has an upper surface flush with the surface of the case, a first side surface connected to the upper surface at a first corner having a right angle, a second side surface connected to the upper surface at a second corner having a right angle, and a lower surface opposite to the upper surface. The first and side surfaces are positioned on the predetermined circumference. The lower surface has a width smaller than a width of the upper surface.

This rotary encoder has a small size and outputs a signal precisely.

BRIEF DESCRIPTION OF THE DRAWINGS

FIG. 10 is a cross-sectional view of a conventional rotary encoder.

FIG. 11 is an exploded perspective view of a conventional rotary encoder.

FIG. 12 is a top view of a case of a conventional rotary encoder.

FIG. 13 is a top view of the case of a conventional rotary encoder.

FIGS. 14A and 14B illustrate signals output from the conventional rotary encoder.

FIG. 15 is a cross-sectional view of a signal contact of a conventional rotary encoder.

DETAILED DESCRIPTION OF PREFERRED EMBODIMENT

Figure 1:
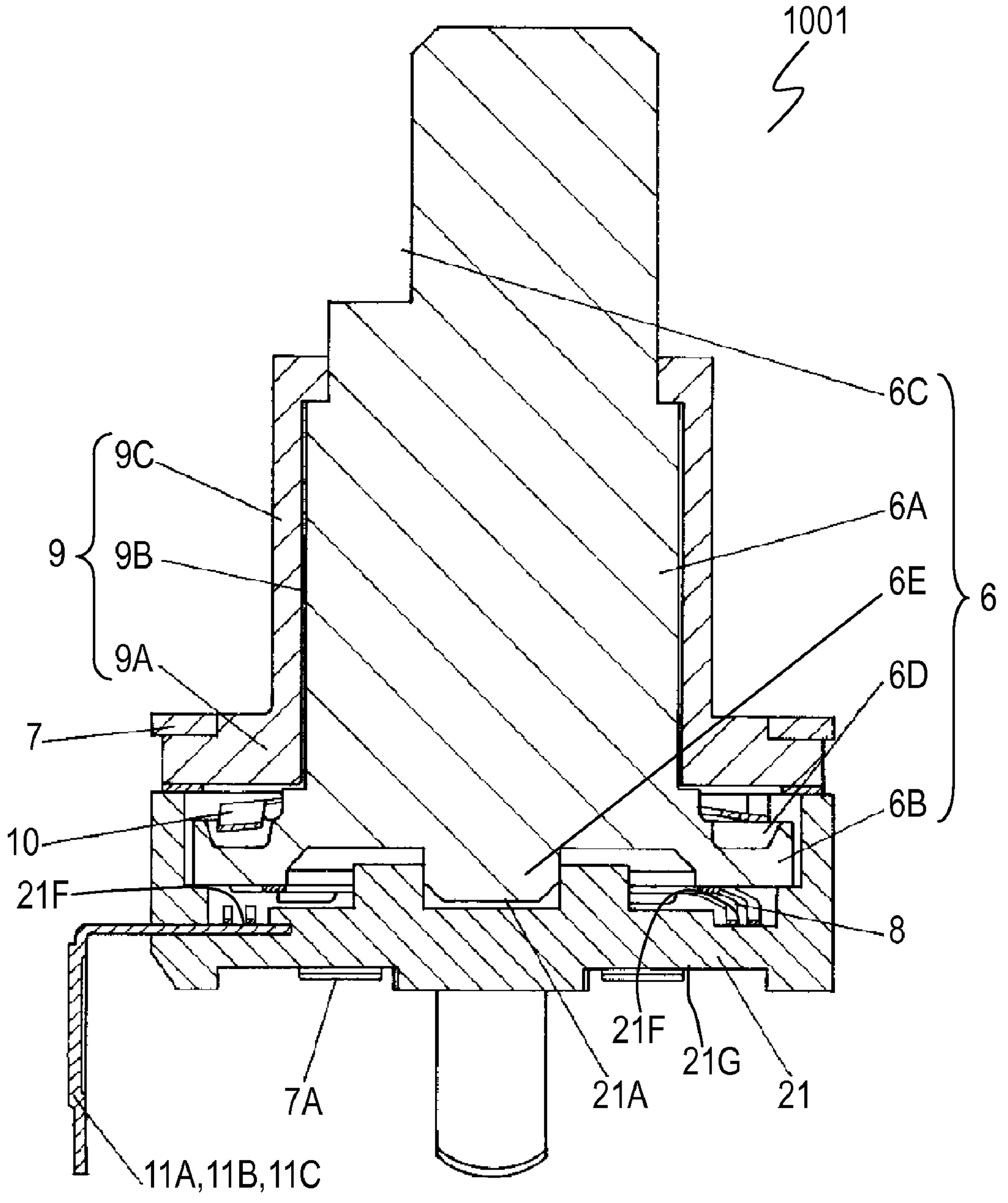
FIG. 1 is a cross-sectional view of a rotary encoder according to an exemplary embodiment of the present invention.
Figure 2:
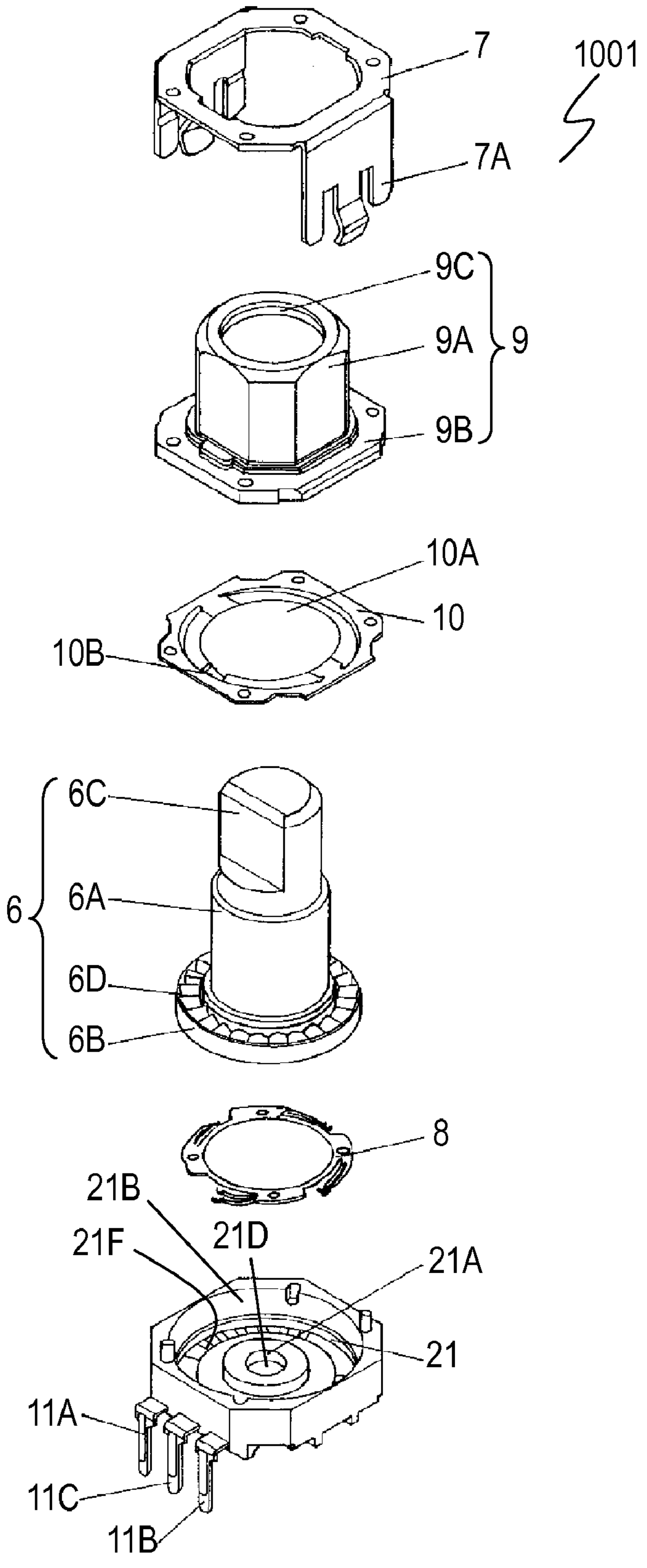
FIG. 2 is an exploded perspective view of the rotary encoder according to the embodiment.

FIGS. 1 and 2 are a cross-sectional view and an exploded perspective view of rotary encoder 1001 according to an exemplary embodiment of the present invention, respectively. Operation shaft 6 is made of insulating resin. Operation shaft 6 has center columnar section 6A having a circular columnar shape and annular flange 6B protruding from an outer circumference of center columnar section 6A. The upper part of center columnar section 6A has cutout 6C therein adapted for engagement in an operation dial. Click grooves 6D extending radially are formed in an upper surface of annular flange 6B. A caulking protrusion is crushed to fix slidable brush 8 to a lower surface of annular flange 6B.

Shaft supporter 9 is made of resin and has protruding section 9A having an octagonal shape and flat plate section 9B having an octagonal shape and protruding from an outer circumference of protruding section 9A. Cylindrical hole 9C having a cylindrical shape is provided in a center of shaft supporter 9 and penetrates shaft supporter 9. Center columnar section 6A of operation shaft 6 is inserted into cylindrical hole 9C. A caulking protrusion is crushed to fix click spring 10 to a lower surface of flat plate section 9B.

Center columnar section 6A of operation shaft 6 is inserted into circular hole 10A provided at the center of click spring 10. Spring 10B having a ring shape is provided around an outer circumference of circular hole 10A. Spring 10B elastically contacts click grooves 6D provided in the upper surface of annular flange 6B and applies an appropriate torque to operation shaft 6 while operation shaft 6 rotates.

Case 21 is made of insulating resin and has recess 21B opening upward. Center hole 21A is provided at a center of a bottom surface 21F of recess 21B has center hole 21A. Circular columnar protrusion 6E provided at a center of a lower surface of operation shaft 6 is inserted into center hole 21A. Case 21 supports operation shaft 6 rotatably. Center hole 21A has a circular shape having center 21D.

Attachment bracket 7 has a squared U-shape and has a center hole. While protruding section 9A of shaft supporter 9 protrudes upward from the center hole, attachment bracket 7 has legs 7A to sandwich shaft supporter 9 and case 21 stacked on each other from above shaft supporter 9. Tips of legs 7A are bent at lower surface 21G of case 21 to accommodate operation shaft 6 and slidable brush 8 between shaft supporter 9 and case 21.

Figure 3:
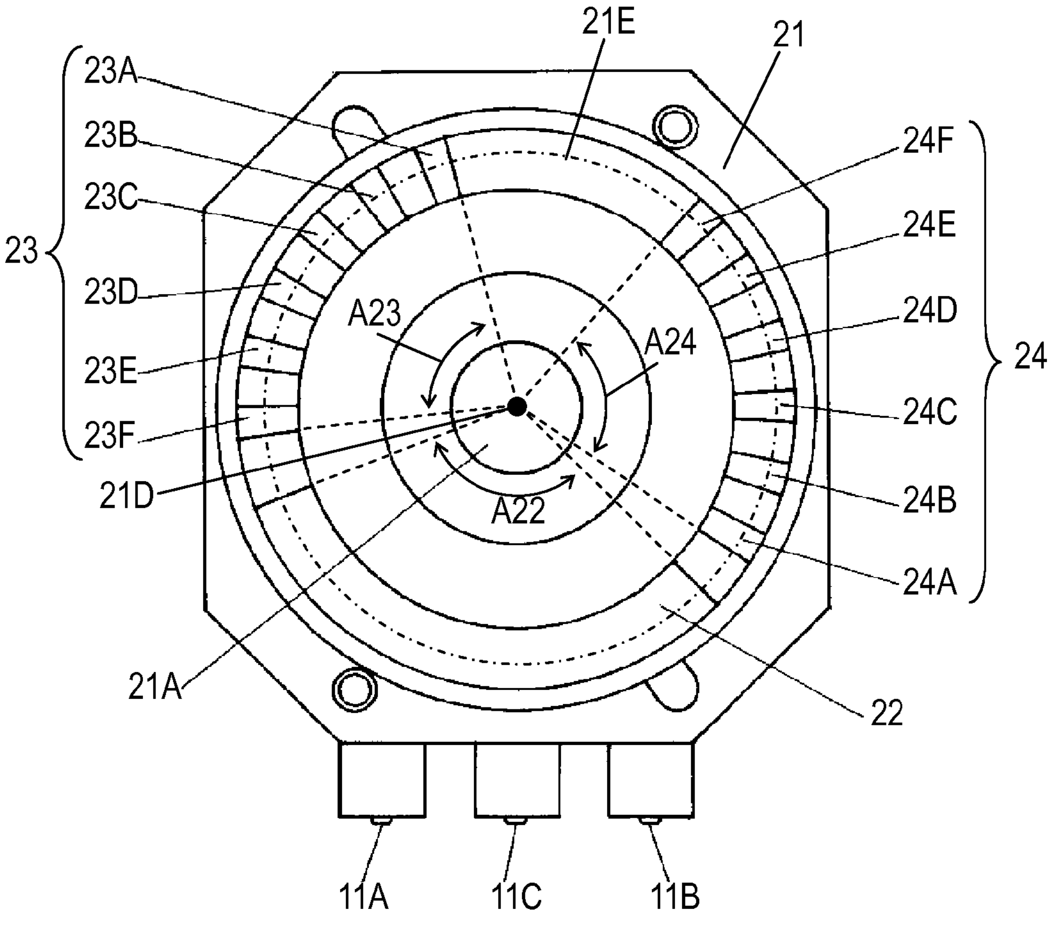
FIG. 3 is a top view of a case of the rotary encoder according to the embodiment.

FIG. 3 is a top view of case 21 of rotary encoder 1001. Center hole 21A has a circular shape having center 21D. Common contact 22 and signal contact patterns 23 and 24 are fixed to a bottom surface of recess 21B by insert molding along circular circumference 21E about center 21D of center hole 21A. Common contact 22 and signal contact patterns 23 and 24 are arranged in arcuate shapes on circumference 21E.

As shown in FIG. 3, signal contact pattern 23 has signal contacts 23A to 23F connected electrically with each other, and signal contact pattern 24 has signal contacts 24A to 24F connected electrically with each other. Signal contact patterns 23 and 24 and common contact 22 are embedded in bottom surface 21F of recess 21B of case 21 so that upper surfaces of signal contacts 23A to 23F and 24A to 24F and common contact 22 are flush with bottom surface 21F of recess 21B of case 21. Signal contacts 23A to 23F and 24A to 24F are arranged on circumference 21E. Signal contacts 23A to 23F are provided on circumference 21E within angular range A23 smaller than 180 degrees about center 21D. Signal contacts 24A to 24F are arranged on circumference 21E within angular range A24 smaller than 180 degrees around center 21D. Angular range A23 having signal contacts 23A to 23F arranged therein is away from angular range A24 having signal contacts 24A to 24F arranged therein, that is, does not overlap angular range A24. Common contact 22 is provided on circumference 21E and has an arcuate shape. Angular range A22, a center angle of the arcuate shape of common contact 22, is larger than angular range A23 having signal contacts 23A to 23F arranged therein and angular range A24 having signal contacts 24A to 24F arranged therein. Angular ranges A22, A23, and A24 are away from each other, that is, do not overlap each other. Signal contact pattern 23, signal contact pattern 24, and common contact 22 are electrically insulated from each other, and are connected to terminals 11A, 11B, and 11C extending to an outside of case 21, respectively.

Figure 4:
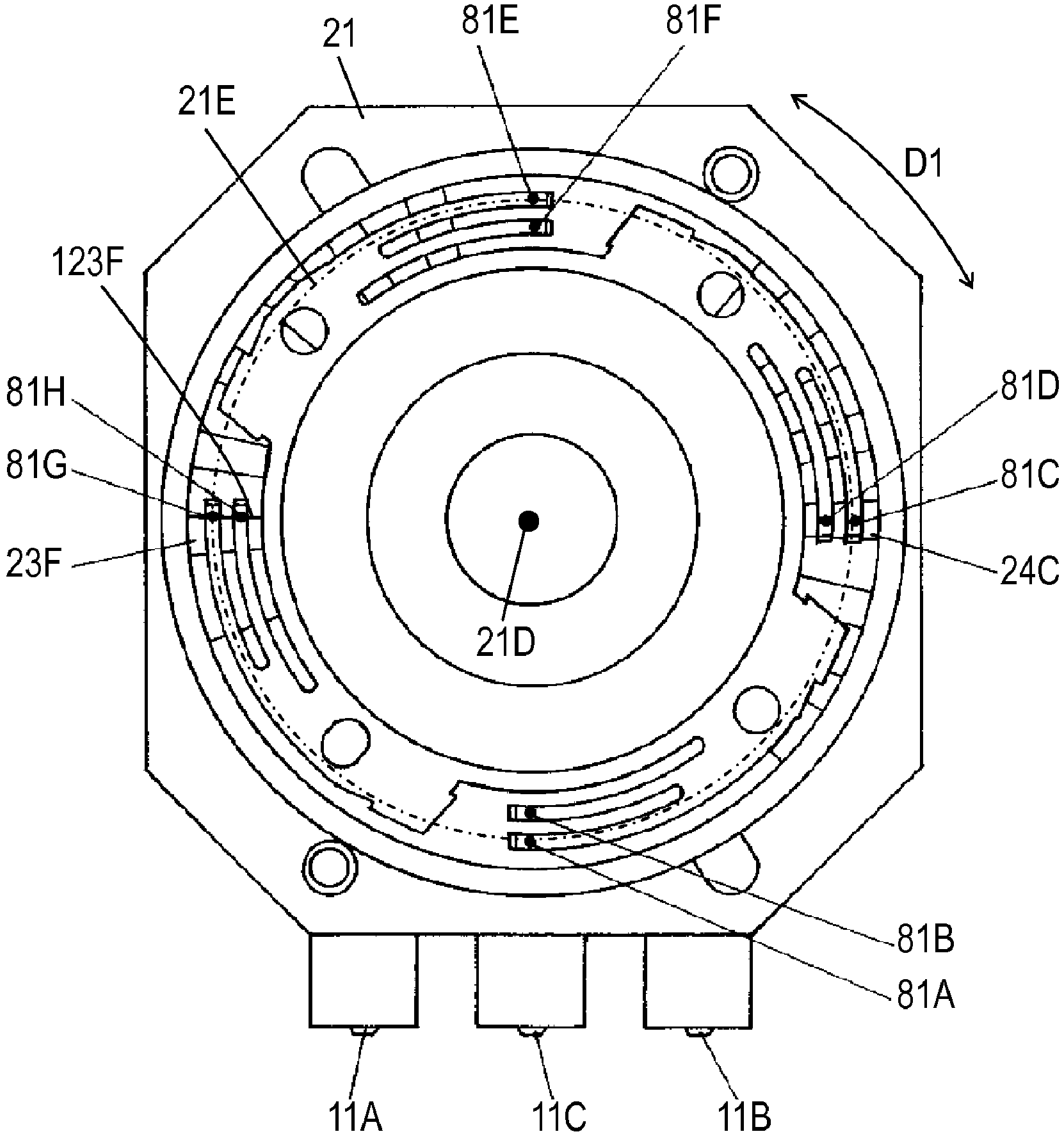
FIG. 4 is a top view of the case of the rotary encoder according to the embodiment.

FIG. 4 is a top view of case 21 of rotary encoder 1001 having slidable brush 8 provided therein. Slidable brush 8 is made of conductive elastic metal plate, and rotatable about center 21D. Slidable brush 8 has contacting sections 81A, 81C, 81E, and 81G arranged about center 21D at angular intervals of 90 degrees, and has contacting sections 81B, 81D, 81F, and 81H arranged about center 21D at angular intervals of 90 degrees. Contacting sections 81B, 81D, 81F, and 81H deviate from contacting sections 81A, 81C, 81E, and 81G in directions toward center 21D, respectively, that is, are located further inward than contacting sections 81A, 81C, 81E, and 81G, respectively. As shown in FIG. 4, contacting sections 81A and 81B contact common contact 22. Contacting sections 81C and 81D contact a center of signal contact 24C. Contacting section 81E and 81F do not contact any of signal contacts 23A to 23F, 24A to 24F and common contact 22. Contacting sections 81G and 81H contact edge 123F of signal contact 23F.

An operation of rotary encoder 1001 will be described below.

Upon operation shaft 6 being rotated, slidable brush 8 fixed to the lower surface of annular flange 6B of operation shaft 6 rotates. The rotation of slidable brush 8 causes contacting sections 81A to 81H to slide on bottom surface 21F of recess 21B of case 21 in direction D1 along circumference 21E. Then, contacting sections 81A to 81H contact and are removed from signal contacts 23A to 23F and 24A to 24F and common contact 22. In particular, contacting sections 81A, 81C, 81E, and 81G slide on bottom surface 21F, signal contacts 23A to 23F and 24A to 24F, and common contact 22 on circumference 21E. Angular range A22, the center angle of the circular arcuate shape of common contact 22, provided along circumference 21E is larger than 90 degrees. Thus, regardless of an angular position of slidable brush 8, at least two of contacting sections 81A to 81H contact common contact 22, that is, slidable brush 8 contacts common contact 22.

Angular range A23 having signal contacts 23A to 23F arranged therein is smaller than 90 degrees. Angular range A24 having signal contacts 24A to 24F arranged therein is also smaller than 90 degrees. Contacting sections 81A and 81B simultaneously contact one of signal contacts 23A to 23F and 24A to 24F. Similarly, contacting sections 81C and 81D simultaneously contact one of signal contacts 23A to 23F and 24A to 24F. Similarly, contacting sections 81E and 81F simultaneously contact one of signal contacts 23A to 23F and 24A to 24F. Similarly, contacting sections 81G and 81H simultaneously contact one of signal contacts 23A to 23F and 24A to 24F and common contact 22. Four contacting sections 81A, 81C, 81E, and 81G are arranged at angular intervals of 90 degrees, and four contacting sections 81B, 81D, 81F, and 81H are arranged at angular interval of 90 degrees. Thus, while operation shaft 6 is rotated 360 degrees to rotate slidable brush 8 by 360 degrees, each of six signal contacts 23A to 23F contacts and is removed from common contact 22 via slidable brush 8 repetitively 4 times. Signal contacts 23A to 23F are connected electrically with each other as signal contact pattern 3. Therefore, while operation shaft 6 is rotated by 360 degrees, signal contact pattern 23 are connected with and disconnected from common contact 22 repetitively 24 times. Similarly, while operation shaft 6 is rotated by 360 degrees to rotate slidable brush 8 by 360 degrees, each of six signal contacts 24A to 24F contacts and is removed from common contact 22 via slidable brush 8 repetitively 4 times. Signal contacts 24A to 24F are connected electrically with each other as signal contact pattern 24. Therefore, while operation shaft 6 is rotated by 360 degrees, signal contact pattern 24 is connected with and disconnected from common contact 22 repetitively 24 times. Thus, while operation shaft 6 is rotated by 360 degrees, the connection and disconnection between common contact 22 and signal contact pattern 23 allows rotary encoder 1001 to output rectangular wave A1 having 24 peaks between terminals 11A and 11B. Similarly, the connection and disconnection between common contact 22 and signal contact pattern 24 allows rotary encoder 1001 to output rectangular wave A2 having 24 peaks between terminals 11A and 11C.

The operation dial attached to operation shaft 6 is rotated to input rectangular waves A1 and A2 to a controller implemented by e.g. a microcomputer. Rotary encoder 1001 is connected to the controller and is used e.g. to adjust the volume of a car audio system. In this case, the controller detects, based on rectangular waves A1 and A2, a rotation direction and a rotation angle of the operation dial (i.e., operation shaft 6) to control the volume of the car audio system.

Figure 5:
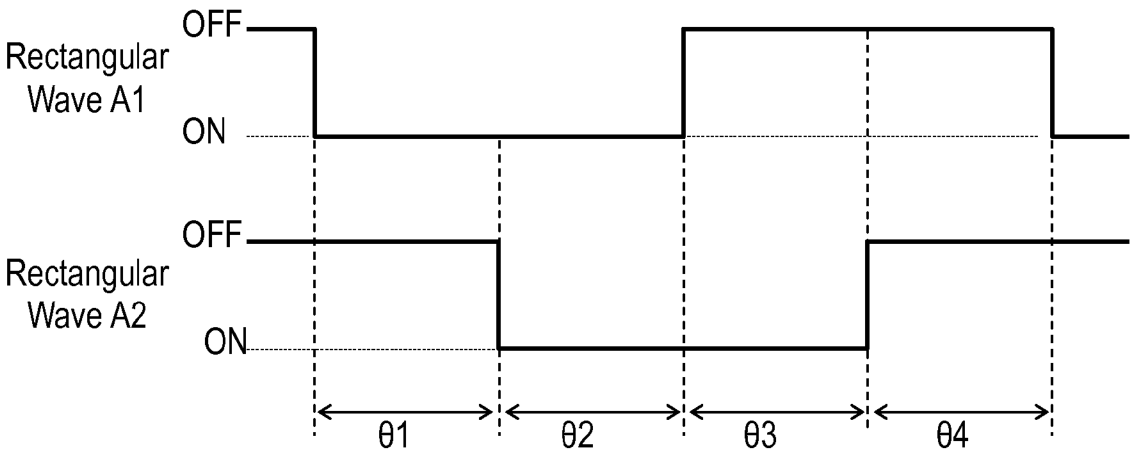
FIG. 5 illustrates a signal output from the rotary encoder according to the embodiment.

FIG. 5 illustrates rectangular waves A1 and A2 output from rotary encoder 1001. In FIG. 5, rectangular wave A1 represents the turning on and off of a switch formed between common contact 22 and signal contact pattern 23, and rectangular wave A2 represents the turning on and off of a switch formed between common contact 22 and signal contact pattern 24, respectively. The angular positions and widths of signal contacts 23A to 23F and 24A to 24F are determined such that rectangular waves A1 and A2 are output with a phase difference of 90 degrees. The combination of rectangular waves A1 and A2 provides four angular ranges θ1 to θ4: (1) angular range θ1 in which rectangular wave A1 represents the turning on, and rectangular wave A2 represents the turning off; (2) angular range θ2 in which rectangular waves A1 and A2 represent the turning on; (3) angular range θ3 in which rectangular wave A1 represents the turning off, and rectangular wave A2 represents the turning on; and (4) angular range θ4 in which rectangular waves A1 and A2 represent the turning off. Based on the order of angular ranges θ1 to θ4, the controller determines a rotation direction of operation shaft 6 and counts the number of the peaks of rectangular waves A1 and A2. Based on the rotation direction and the number of the peaks, the controller controls a controllable object. In the case that the object is the volume of the car audio system, the controller determines, based on the rotation direction, a changing direction in which the volume is increased or decreased. The controller also determines a change amount based on the number of the peaks. Then, the controller changes the volume by the determined change amount in the determined changing direction.

Figure 6:
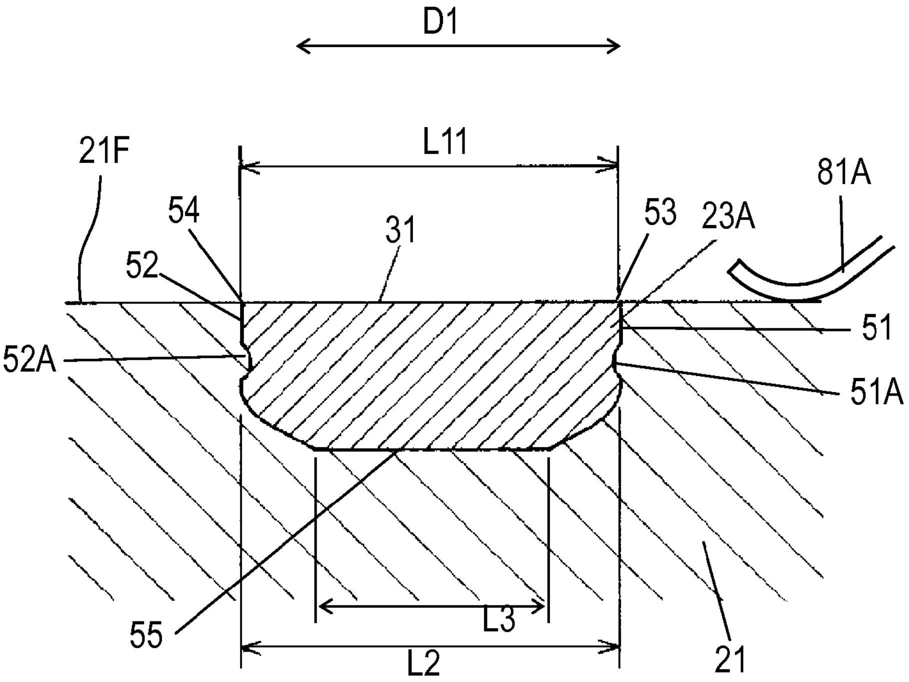
FIG. 6 is a cross-sectional view of a signal contact of the rotary encoder according to the embodiment.

In rotary encoder 1001 according to the embodiment, shapes of signal contacts 23A to 23F and 24A to 24F are determined so as to output ideal rectangular waves A501 and A502 shown in FIG. 14A. FIG. 6 is a cross-sectional view of signal contact 23A (23B to 23F and 24A to 24F) along circumference 21E. Signal contact 23A (signal contact pattern 3) is embedded in bottom surface 21F of case 21, and has upper surface 31 being exposed and being flush with bottom surface 21F of recess 21B of case 21. The lengths of angular ranges θ1 to θ4 shown in FIG. 5 depend on width L11 of upper surface 31 of signal contact 23A (23B to 23F and 24A to 24F) in direction D1 along circumference 21E. Signal contact 23A (23B to 23F and 24A to 24F) further has side surface 51 connected with upper surface 31 at corner 53 and side surface 52 connected with upper surface 31 at corner 54. Corners 53 and 54 are positioned opposite to each other across upper surface 31. Side surfaces 51 and 52 are arranged opposite to each other in direction D1. Corners 53 and 54 are positioned on circumference 21E and contact contacting sections 81A, 81C, 81E, and 81G of slidable brush 8. Corners 53 and 54 each have a right angle. Signal contact 23A further has flat lower surface 55 opposite to upper surface 31. Lower surface 55 has width L3 in direction D1. Width L11 of upper surface 31 in direction D1 along circumference 21E is larger than width L3 of lower surface 55. The cross section of signal contact 23A along circumference 21E has substantially a trapezoidal shape. Side surfaces 51 and 52 have recesses 51A and 52A therein, respectively. Resin material of case 21 enters recesses 51A and 52A and prevents signal contact 23A (23B to 23F, 24A to 24F) embedded in bottom surface 21F of case 21 from being removed from bottom surface 21F of case 21 upward.

Rotary encoder 1001 is not provided with shear drop portions 14B of conventional rotary encoder 501 shown in FIG. 15, and each of corners 53 and 54 of signal contact 23A (23B to 23F, 24A to 24F) defines a right angle. Therefore, resin material of case 21 does not cover upper surface 31 of signal contact 23A. Thus, width L11 of upper surface 31 in direction D1 is equal to width L2 of the signal contact, thus causing substantially no variation of width L11.

A method of manufacturing rotary encoder 1001 will be described.

Figure 7A:
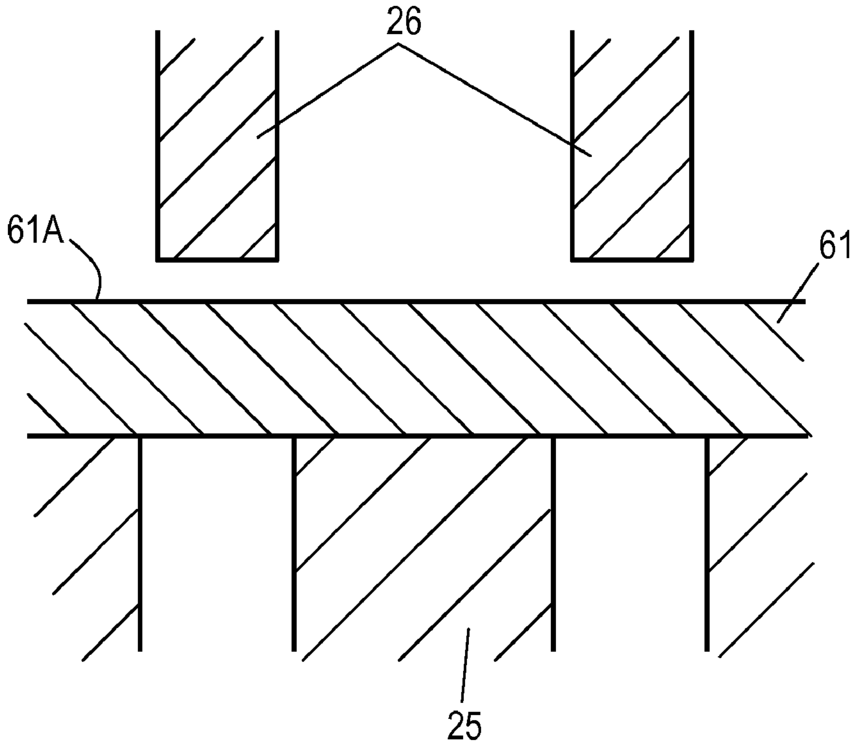
FIGS. 7A and 7B are cross-sectional views of the rotary encoder according to the embodiment for illustrating a method of manufacturing the rotary encoder.
Figure 7B:
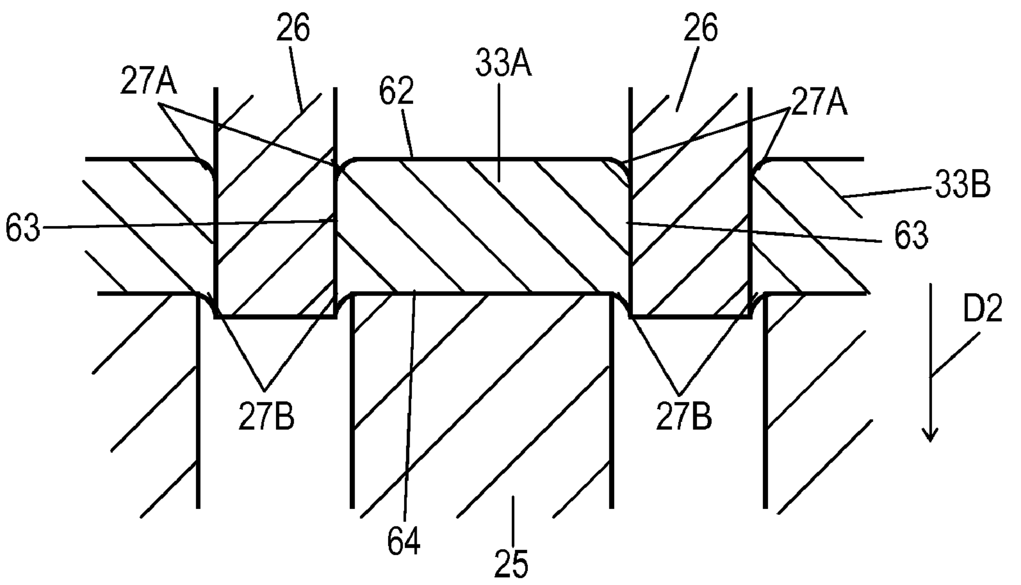

FIGS. 7A and 7B are cross-sectional views of signal contact patterns 23 and 24 of rotary encoder 1001 for illustrating the method of manufacturing contact patterns 23 and 24. As shown in FIG. 7A, metal plate 61, such as a brass plate, is placed on punching stand 25 to punch out metal plate 61 with punching die 26 from upper surface 61A, as shown in FIG. 7B. This punching processing provides incomplete contacts 33A and 33B to become signal contacts 23A and 23B, respectively. Incomplete contact 33A (33B) has upper surface 62 to become upper surface 31 of signal contact 23A (23B) and lower surface 64 opposite to upper surface 62. When metal plate 61 is punched out with punching die 26 from upper surface 61A, die 26 pulls side surface 63 of incomplete contact 33A (33B) in direction D2 from upper surface 62 to lower surface 64. This produces shear drop portions 27A at a corner connecting upper surface 62 and side surface 63 and burr 27B protruding in direction D2 at a corner connecting lower surface 64 and side surface 63.

Figure 8:
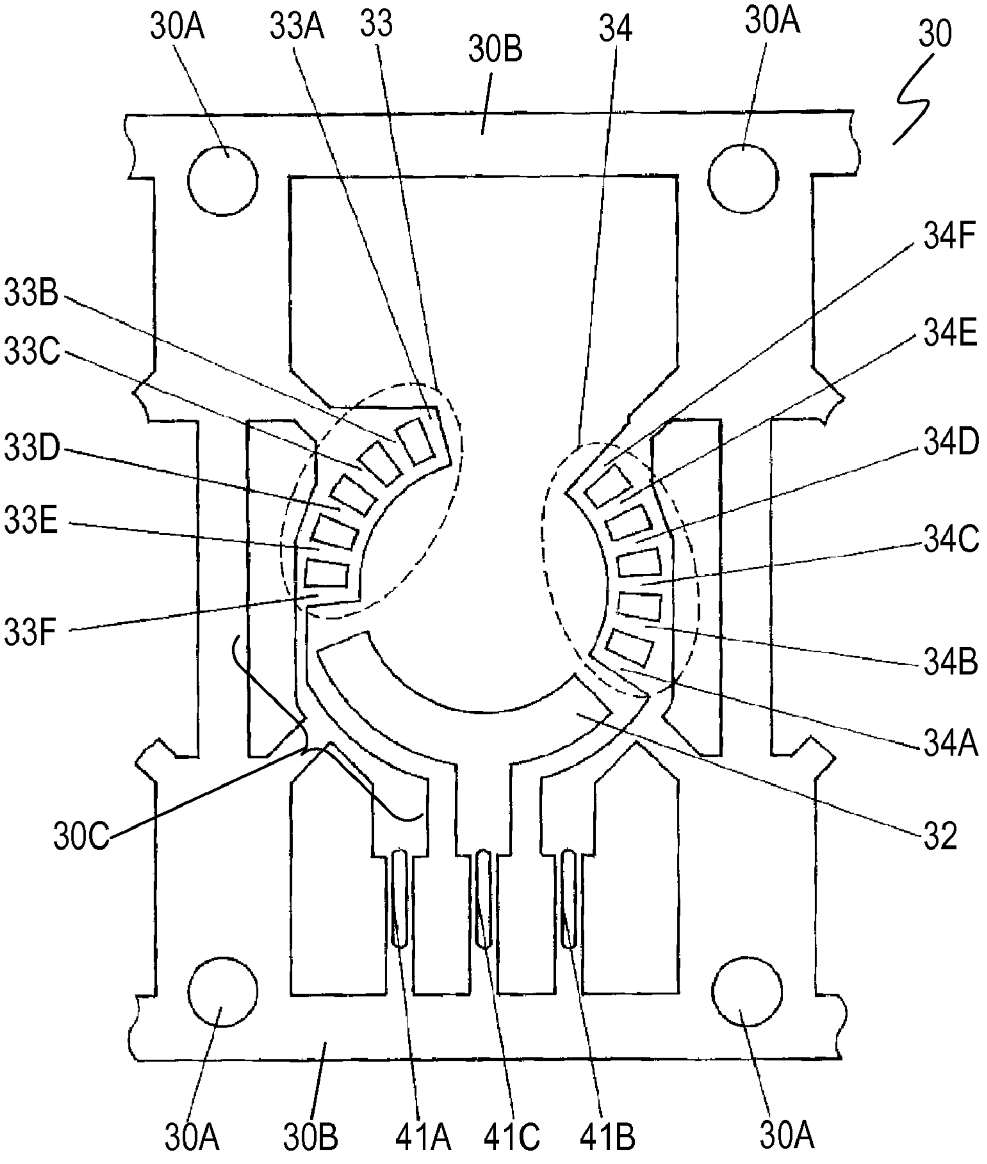
FIG. 8 is a top view of a contact plate hoop for preparing a signal contact of the rotary encoder according to the embodiment.

FIG. 8 is a top view of contact plate hoop 30 providing signal contact patterns 23 and 24 and common contact 22. As shown in FIGS. 7A and 7B, contact plate hoop 30 is obtained by punching out metal plate 61 with punching die 26 and punching stand 25. Contact plate hoop 30 includes contact plates 30C and outer frame 30B connected to contact plates 30C. Contact plates 30C have incomplete contact patterns 33 and 34 and incomplete contact 32. Outer frame 30B has positioning holes 30A therein arranged at predetermined intervals. Incomplete contact patterns 33 and 34 and incomplete contact 32 provide signal contact patterns 23 and 24 and common contact 22, respectively. Incomplete contact pattern 33 has incomplete contacts 33A to 33F providing signal contacts 23A to 23F, respectively. Incomplete contact pattern 34 has incomplete contacts 34A to 34F providing signal contacts 24A to 24F, respectively. Incomplete contacts 33C to 33F and 34A to 34F have shear drop portions 27A and burrs 27B similarly to incomplete contacts 33A and 33B shown in FIG. 7B.

Contact plate hoop 30 further includes incomplete terminals 41A, 41B and 41C providing terminals 11A and 11B, 11C, respectively. Incomplete terminal 41A is connected to incomplete contact pattern 33. Incomplete terminal 41B is connected to incomplete contact pattern 34. Incomplete terminal 41C is connected to incomplete contact 32.

Figure 9A:
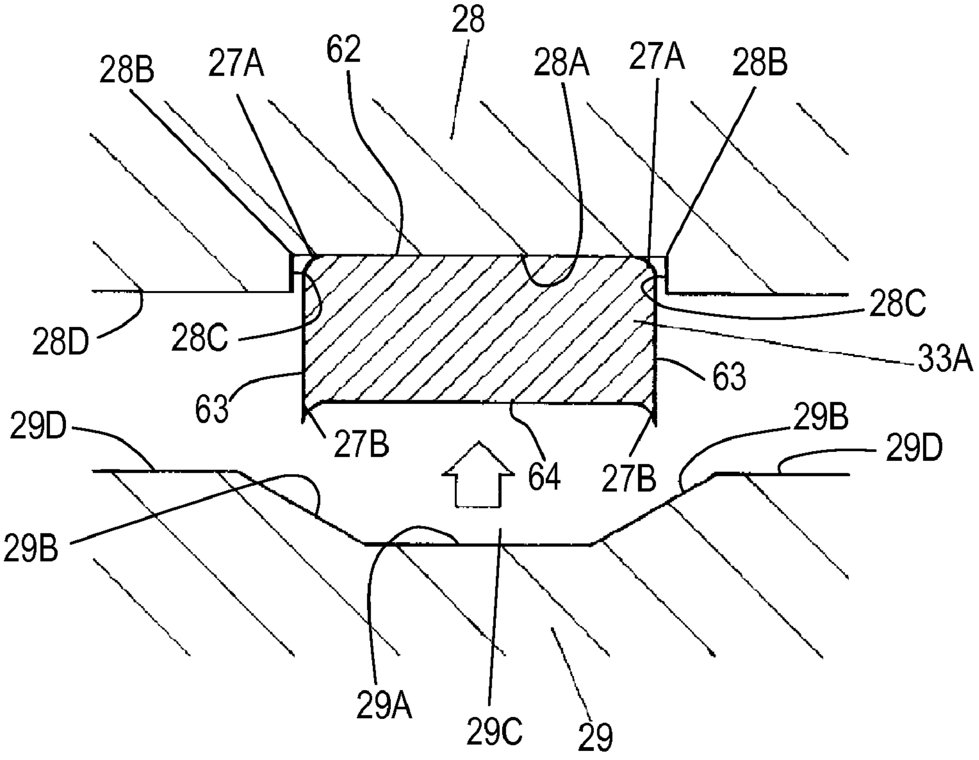
FIGS. 9A and 9B are a cross-sectional view of the signal contact of the rotary encoder according to the embodiment for illustrating a method of manufacturing the signal contact.
Figure 9B:
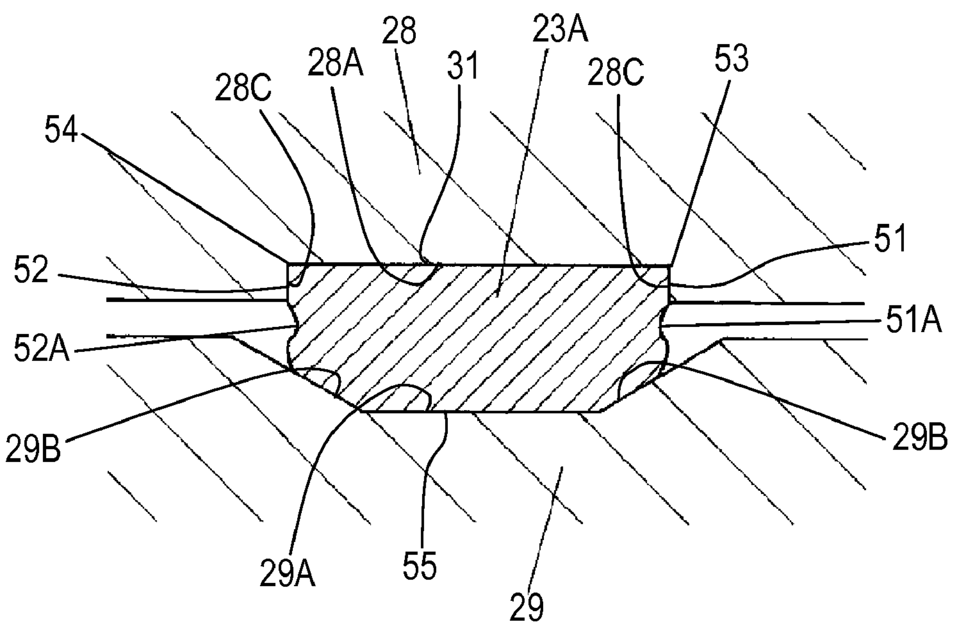

FIGS. 9A and 9B are cross-sectional views of signal contact 23A (23B to 23F and 24A to 24F) for illustrating a method of manufacturing signal contact 23A. Incomplete contact 33A (33B to 33F and 34A to 34F) is formed with dies 28 and 29 to provide signal contact 23A (23B to 23F and 24A to 24F). Die 29 presses lower surface 64 of incomplete contact 33A. Upper surface 29D of die 29 has recess 29C. Recess 29C has flat bottom surface 29A and slope surfaces 29B extending from bottom surface 29A to upper surface 29D. Slope surfaces 29B are positioned opposite to each other across bottom surface 29A. Bottom surface 29A presses a center portion of lower surface 64 of incomplete contact 33A toward upper surface 62 upward. Slope surfaces 29B press burrs 27B toward a center of incomplete contact 33A so as to press burrs 27B inward and upward. Lower surface 28D of die 28 has recess 28C therein. Recess 28C has flat bottom surface 28A and side surfaces 28B extending from bottom surface 28A to upper surface 28D. Bottom surface 28A presses upper surface 62 of incomplete contact 33A downward toward lower surface 64. A corner connecting bottom surface 28A and each of side surfaces 28B defines a right angle to form a right angle forming section.

As shown in FIG. 9B, signal contact 23A is formed by pressing incomplete contact 33A in recesses 28C and 29C of dies 28 and 29. Each of slope surfaces 29B of die 29 presses each of burrs 27B downward towards the center of incomplete contact 33A. Incomplete contact 33A is pressed onto the right angle forming sections each defining a right angle. This process provides signal contact 23A having corners 53 of upper surface 31 each having a right angle. Dies 28 and 29 press incomplete contact 33A in between, and form recesses 51A and 52A in side surfaces 51 and 52. Signal contacts 23B to 23F and 24A to 24F are also formed similarly to signal contact 23A by forming incomplete contacts 33B to 33F and 34A to 34F with dies 28 and 29.

Then, contact plate hoop 30 is molded with resin material, thus insert-molding hoop 30. Then, outer frame 30B is cut to be removed from signal contact patterns 33 and 34, common contact 22, and terminals 11A to 11C to provide case 21. Thus, signal contacts 23A to 23F, 24A to 24F are molded with resin material, thus insert-molding them. Then, outer frame 30B is cut to be removed from signal contact patterns 33 and 34, common contact 22, and terminals 11A to 11C to provide case 21.

As shown in FIG. 2, the caulking protrusion is provided on the lower surface of operation shaft 6 is crushed to fix slidable brush 8 to the lower surface of operation shaft 6. The caulking protrusion provided on the lower surface of shaft supporter 9 to fix click spring 10 to the lower surface of shaft supporter 9. Then, operation shaft 6 having slidable brush 8 fixed thereto and shaft supporter 9 having click spring 10 fixed thereto are stacked on case 21. Then, attachment bracket 7 holds a range from the top of shaft supporter 9 to lower surface 21G of case 21, and legs 7A fix attachment bracket 7 to case 21, thereby providing rotary encoder 1001.

In rotary encoder 1001 according to this embodiment, width L11 of upper surface 31 exposed from bottom surface 21F of recess 21B of case 21 of signal contact 23A (23B to 23F and 24A to 24F) is equal to width L2 of signal contact 23A. Upper surface 31 is accurately formed with recess 28C of die 28. Thus, widths of angular ranges $\theta 1$ to $\theta 4$ shown in FIG. 5 can be predetermined widths to allow the controller to read angular ranges $\theta 1$ to $\theta 4$ reliably, accordingly allowing the rotary encoder 1001 to detect the rotation direction and the rotation amount of operation shaft 6 precisely.

Corners 53 and 54 of upper surface 31 of signal contacts 23A to 23F and 24A to 24F determine an accuracy of the signals. According to the embodiment, dies 28 and 29 allow each of corners 53 and 54 easily to have a right angle accurately. This process reduces intervals between signal contacts 23A to 23F and 24A to 24F, and accordingly, allows rotary encoder 1001 to have a small size and to be precise.

According to the embodiment, terms, such as "upper surface", "lower surface", "upward", and "downward", indicating directions indicate relative directions depending on the positions of components constituting rotary encoder 1001, and do not indicate absolute directions, such as a vertical direction.

What is claimed is:

1. A rotary encoder comprising:
- a case made of insulating resin and having a surface;
- an operation shaft which is rotatable;
- a slidable brush fixed to the operation shaft, the slidable brush being conductive, the slidable brush having a contacting section slidable on the surface of the case on a predetermined circumference according to a rotation of the operation shaft; and
- a signal contact embedded in the surface of the case;
- wherein the signal contact has
  - an upper surface flush with the surface of the case,
  - a first side surface connected to the upper surface at a first corner having a right angle, the first side surface being positioned on the predetermined circumference,
  - a second side surface connected to the upper surface at a second corner having a right angle, the second side surface being opposite to the first side surface, the second side surface being positioned on the predetermined circumference, and
  - a lower surface opposite to the upper surface, the lower surface having a width smaller than a width of the upper surface.

2. A method of manufacturing a rotary encoder, comprising:
- forming an incomplete contact by punching out a metal plate having an upper surface from the upper surface, the incomplete contact having an upper surface and a lower surface;
- providing a first die having a lower surface having a recess therein, the recess of the first die having a bottom surface and side surfaces connected to the bottom surface at corners each having a right angle;
- providing a second die having an upper surface having a recess therein, the recess of the second die having a bottom surface and slope surfaces opposite to each other and connected with the bottom surface and the upper surface of the second die;
- forming a signal contact having an upper surface by pressing the incomplete contact with the first die and the second die so that the upper surface of the incomplete contact is positioned in the recess of the first die and corners of the lower surface of the incomplete contact are pressed with the slope surfaces of the recess of the second die;
- forming a case by molding and forming the signal contact with resin material, the case having a surface having the signal contact embedded therein, the surface of the case being flush with the upper surface of the signal contact;
- providing a rotatable operation shaft; and
- providing a slidable brush having a contacting section slidable on the signal contact and the surface of the case according to a rotation of the operation shaft.

* * * * *